(12) United States Patent
Jian et al.

(10) Patent No.: US 11,877,493 B2
(45) Date of Patent: *Jan. 16, 2024

(54) DISPLAY PANEL HAVING DISPLAY REGIONS AND DISPLAY APPARATUS

(71) Applicant: Wuhan Tianma Micro-Electronics Co., Ltd., Wuhan (CN)

(72) Inventors: Shoufu Jian, Shanghai (CN); Dongliang Dun, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/860,271

(22) Filed: Jul. 8, 2022

(65) Prior Publication Data

US 2022/0344415 A1 Oct. 27, 2022

Related U.S. Application Data

(63) Continuation of application No. 16/587,259, filed on Sep. 30, 2019, now Pat. No. 11,424,297.

(30) Foreign Application Priority Data

Jun. 29, 2019 (CN) .......................... 201910580878.X (51) Int. Cl.
    *H01L 27/32* (2006.01)
    *H10K 59/60* (2023.01)
    (Continued)

(52) U.S. Cl.
    CPC ........... *H10K 59/60* (2023.02); *H10K 59/131* (2023.02); *H10K 59/353* (2023.02)

(58) Field of Classification Search
    CPC ............. H01L 27/3227; H01L 27/3218; H01L 27/3276
    See application file for complete search history.

(56) References Cited

U.S. PATENT DOCUMENTS 5,936,694 A * 8/1999 Suzuki ............. G02F 1/134336
    349/151
2009/0289882 A1 * 11/2009 Masui .................. G09G 3/3688
    345/88

(Continued)

FOREIGN PATENT DOCUMENTS

| CN | 108010947 A | 5/2018 |
|---|---|---|
| CN | 108648680 A | 10/2018 |
| CN | 108922900 A | 11/2018 |

OTHER PUBLICATIONS

Office Action for the Chinese Application No. 201910580878, dated Jan. 6, 2021, 15 pages.

*Primary Examiner* — Kwang-Su Yang
(74) *Attorney, Agent, or Firm* — KDW Firm PLLC (57) ABSTRACT

A display panel includes: a first display region used for disposing a sensor; a second display region surrounding the first display region; first pixel units in the first display region; second pixel units in the second display region; and an array substrate, where the array substrate includes a plurality of first data lines and a plurality of second data lines, and the plurality of first data lines pass through the first display region; where in the first display region, each of the plurality of first data lines is electrically connected to a sub-pixel of the first pixel units.

14 Claims, 9 Drawing Sheets

(51) Int. Cl.
*H10K 59/131* (2023.01)
*H10K 59/35* (2023.01)

(56) References Cited

U.S. PATENT DOCUMENTS

| | | |
|---|---|---|
| 2018/0089485 A1* | 3/2018 | Bok ................. G06F 3/0445 |
| 2018/0219058 A1* | 8/2018 | Xiang ............... H01L 27/3225 |
| 2019/0101673 A1* | 4/2019 | Yao ................. G02F 1/133374 |
| 2019/0212788 A1* | 7/2019 | Kwak ............... G06F 3/04883 |
| 2019/0310724 A1* | 10/2019 | Yeke Yazdandoost ............... H10K 59/121 |
| 2020/0066809 A1* | 2/2020 | Liu .................. H01L 27/3234 |
| 2020/0111401 A1* | 4/2020 | Zhao ................ G09G 3/2003 |

* cited by examiner

DISPLAY PANEL HAVING DISPLAY REGIONS AND DISPLAY APPARATUS

CROSS-REFERENCES TO RELATED APPLICATIONS

This is a continuation of U.S. patent application Ser. No. 16/587,259 titled "DISPLAY PANEL AND DISPLAY APPARATUS" and filed on Sep. 30, 2019, which claims priority to Chinese Patent Application No. 201910580878.X filed on Jun. 29, 2019, the disclosures of which are incorporated herein by reference in their entireties.

TECHNICAL FIELD

The application relates to the field of display technologies and, in particular, to a display panel and a display apparatus.

BACKGROUND

With the development of science and technology, more and more electronic devices with display functions are widely applied to people's daily life and work, bringing great convenience to people's daily life and work, and becoming an essential, important tool for people today.

Display panels are an important component for implementing the display function of an electronic device. The display panel may be integrated with optical electronic elements. Different screen regions have different transparency requirements. By reducing the pixel density of a screen region provided with optical electronic elements, the transparency of this screen region may be improved.

However, a reduction of the pixel density in the region provided with optical electronic elements results in a display non-uniformity in the screen region provided with the optical electronic elements, which affects the display effect of the display panel.

SUMMARY

The embodiments of the present disclosure provide a display panel and a display apparatus, to improve the display uniformity in a region where an optical electronic element is disposed.

In a first aspect, an embodiment of the present disclosure provides a display panel. The display panel includes: a first display region, a second display region surrounding the first display region, first pixel units in the first display region, and second pixel units in the second display region, where the first display region is used for disposing a sensor.

The display panel further includes an array substrate. The array substrate includes a plurality of first data lines extending in a column direction and a plurality of second data lines. The first data lines pass through the first display region.

In the first display region, each of the first data lines is electrically connected to one or more sub-pixels of the first pixel units.

In a second aspect, an embodiment of the present disclosure further provides a display apparatus. The display apparatus includes the display panel provided by any embodiment of the present disclosure and a sensor disposed on a non-display side of the first display region of the display panel.

In the present disclosure, the display panel includes the first display region and the second display region, a sensor is arranged in the first display region, and the signal generated by the sensor can penetrate the display panel. An array substrate of the display panel includes first data lines and second data lines, and the first data lines extend through the first display region. In the first display region, each first data line is electrically connected to one or more sub-pixels in the first display region, such that each first data line is connected to one or more sub-pixels in the first display region, avoiding the situation that the first data line is not connected to the sub-pixel in the first display region, reducing the data line load difference in the first display region, and improving the display uniformity of the display panel.

DETAILED DESCRIPTION

Hereinafter the present disclosure will be further described in detail in conjunction with the drawings and embodiments. It is to be understood that the specific embodiments set forth below are intended to illustrate and not to limit the present disclosure. Additionally, it is to be noted that, for ease of description, only part, not all, of the structures related to the present disclosure are illustrated in the drawings.

A display panel may have a reserved region for arranging a sensor, and the reserved region has a lower pixel unit density. With this reserved region, the display panel does not need an escaping hole for an electronic element, so the display panel is more attractive. Pixel units are also disposed in the reserved region and used for displaying images. However, the density of the pixel units in the reserved region is lower than the density of the pixel units in the region around the reserved region. For example, the ratio of the density of the pixel units in the reserved region to the density of the pixel units in the region around the reserved region may be 1:3 or 1:6, and so on. In this case, a data line passing through the reserved region may be not connected to any sub-pixel in the reserved region, and the load of this data line may be greatly different from that of other data lines, and the large load difference may cause display brightness non-uniformity and reduce the display effect of the display panel.

In order to solve the above problems, an embodiment of the present disclosure provides a display panel. The display panel includes a first display region and a second display region. Multiple first pixel units are disposed in the first display region and arranged in an array. Multiple second pixel units are disposed in the second display region and arranged in an array. A density of the first pixel units in the first display region is lower than a density of the second pixel units in the second display region.

The display panel further includes an array substrate, and the array substrate is provided with a plurality of first data lines and a plurality of second data lines extending in a column direction. The first data lines pass through the first display region, that is, each of the first data lines has a segment in the first display region.

In the first display region, each of the first data lines is electrically connected to one or more sub-pixels of the first pixel units.

The embodiment of the present disclosure provides the display panel. The display panel includes the first display region and the second display region. The first display region serves as a reserved region for sensors. The density of the pixel units in the first display region is lower than the density of the pixel units in the second display region, and a signal generated by the sensor can penetrate the display panel. The array substrate of the display panel includes the first data lines and the second data lines extending in the column direction, and the first data lines pass through the first display region. Each first data line in the first display region is electrically connected to one or more sub-pixels in the first display region, so the load of each first data line in the first display region includes the sub-pixel in the first display region, avoiding that the first data line in the first display region is not connected to any sub-pixel in the first display region, reducing the load difference of the data lines in the first display region, and improving the display uniformity of the display panel.

The above is a core idea of the present disclosure. Technical solutions in the embodiments of the present disclosure will be described clearly and completely in conjunction with drawings in the embodiments of the present disclosure. Based on the embodiments of the present disclosure, all other embodiments obtained by those skilled in the art without making creative work are within the scope of the present disclosure.

Figure 1:
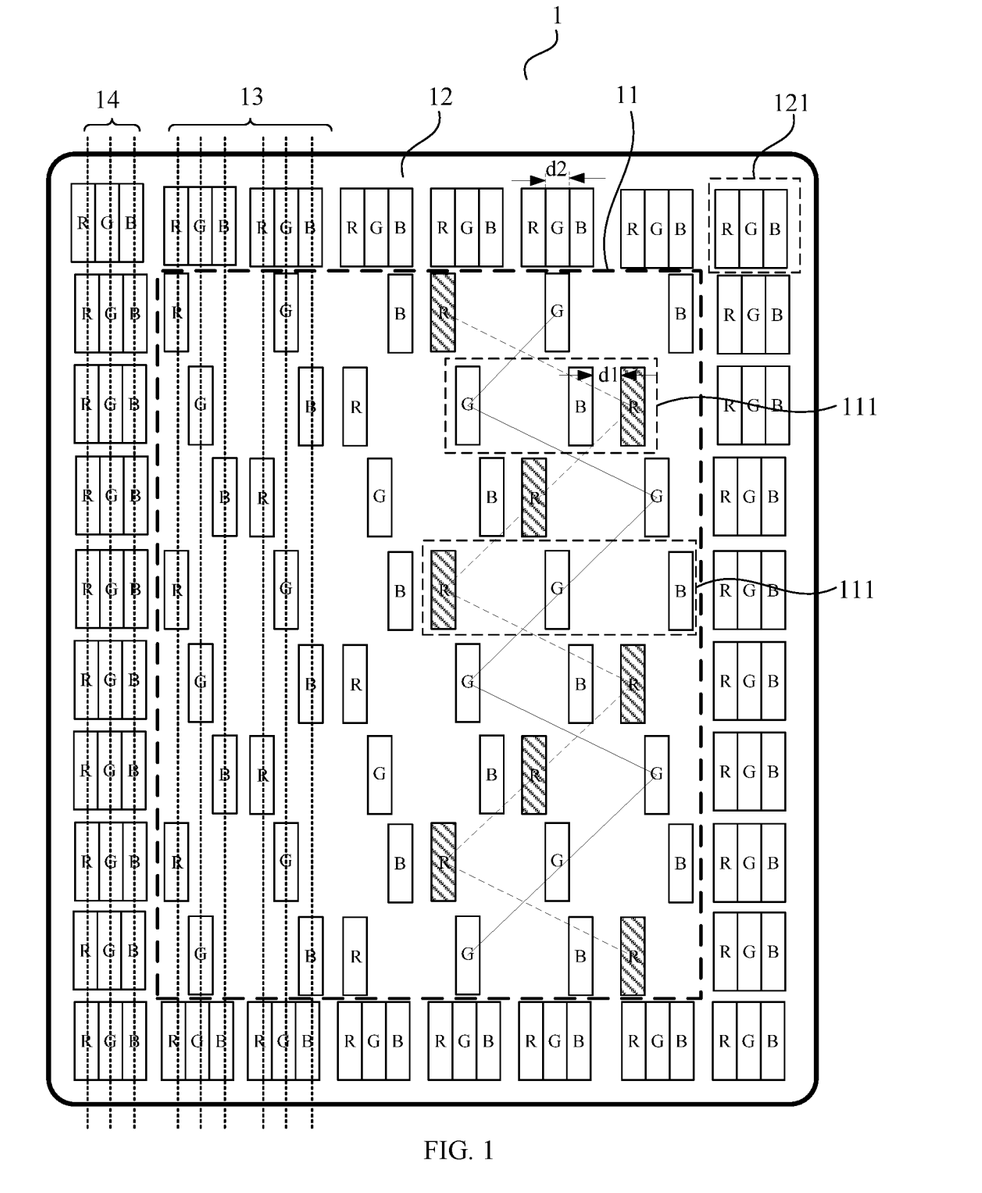
FIG. 1 is a schematic view of a display panel according to an embodiment of the present disclosure.

FIG. 1 is a schematic view of a display panel according to an embodiment of the present disclosure. As shown in FIG. 1, a display panel 1 includes a first display region 11 and a second display region 12. The first display region 11 may be surrounded by the second display region 12, as shown in FIG. 1. In other embodiments, the second display region 12 may be disposed on at least one side of the first display region 11. For example, the second display region 12 may be disposed on one side or two sides of the first display region 11. The position of the first display region 11 and the position of the second display region 12 are not limited in the embodiment, and the embodiment uses the configuration that the second display region 12 surrounds the first display region 11 as an example for illustration. First pixel units 111 are disposed in the first display region 11 and arranged in an array. Second pixel units 121 are disposed in the second display region 12 and arranged in an array. Each first pixel unit 111 includes multiple sub-pixels configured to emit lights in different color, and each second pixel unit 121 also includes multiple sub-pixels configured to emit lights in different color. It is set that the density of the first pixel units 111 is lower than the density of the second pixel units 121. In one or more embodiments, the first display region 11 may be reused as a reserved region for arranging sensors. The first display region 11 is transparent to an optical signal so that the sensor in the reserved region can work smoothly. The display panel 1 further includes an array substrate. The array substrate includes a drive circuit for driving the pixel units, and the array substrate further includes a plurality of first data lines 13 and a plurality of second data lines 14 extending in a column direction. The first data lines 13 pass through the first display region 11 and are electrically connected to the sub-pixels in the first display region 11 to supply a data voltage to the sub-pixels in the first display region 11. The second data lines 14 may only pass through the second display region 12 and be configured to supply a data voltage to the sub-pixels within the second display region 12. It is to be noted that the first data line 13 and the second data line 14 shown by dotted lines in the figure are only for convenience of illustration, and do not represent the actual positions of the data lines, the data lines are disposed on the array substrate and are disposed on a non-display side of the pixel units, and the data lines are invisible in the observation direction shown in FIG. 1.

Figure 2:
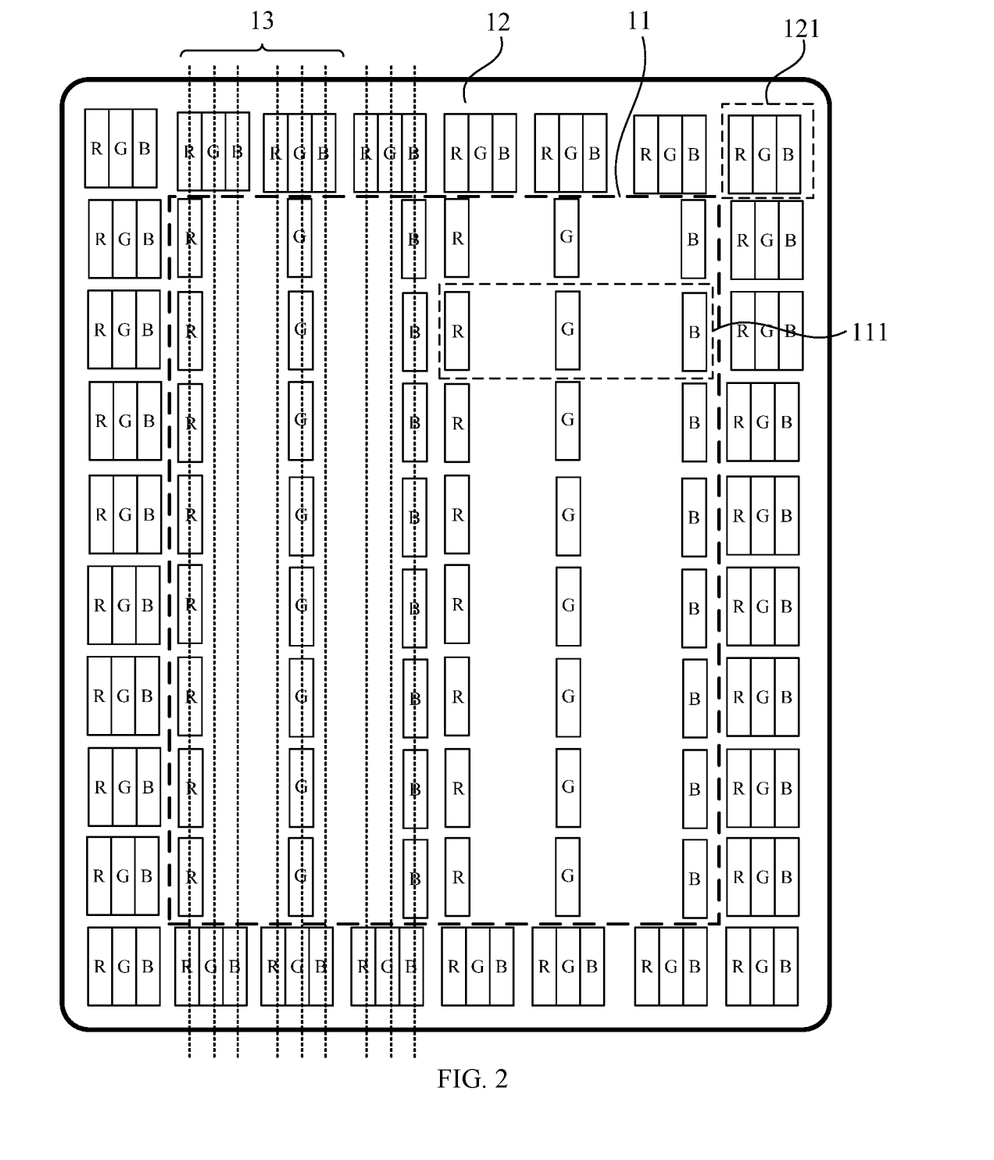
FIG. 2 is a schematic view of a comparison display panel according to an embodiment of the present disclosure.

As shown in FIG. 1, in the first display region 11, each first data line 13 is electrically connected to the sub-pixel of the first pixel unit 111, and thus the load difference between the first data lines 13 is small, which is beneficial to the display uniformity of the first pixel unit 111 in the first display region 11. FIG. 2 is a schematic view of another display panel. The display panel shown in FIG. 2 is used as a comparison example. In the display panel shown in FIG. 2, the ratio of the pixel unit density of the first pixel units 111 in the first display region 11 to the pixel unit density of the second pixel units 121 in the second display region 12 is 1:3, each first pixel unit 111 corresponds to three columns of second pixel units 121, the sub-pixels in the same column in the first display region 11 are configured to emit light of the same color, and each column of sub-pixels in the first display region 11 is disposed in the same column with the sub-pixels in the second pixel unit 121 which are configured to emit light of the same color as the column in the first display region 11. In the display panel shown in FIG. 2, some first data lines 13 passing through the first display region 11 are not connected to the sub-pixel in the first display region 11, and thus have a large load difference with other first data lines, so that the brightness difference of the sub-pixels connected to the first data lines 13 with large load differences is relatively large, and the display uniformity is poor. In the display panel 1 provided by the present disclosure, with the configuration of the sub-pixels in the first display region 11 shown in FIG. 1, each first data line 13 is connected to the sub-pixel in the first display region 11, and the display uniformity is enhanced.

As shown in FIG. 1, the first data lines 13 extend in the first display region 11 and the second display region 12. In the present embodiment, each first data line 13 extends in the first display region 11 and the second display region 12, and provides the data voltage to the first pixel units 111 in the first display region 11 and the second pixel units 121 in the second display region 12, facilitating the arrangement of the data lines 13 on the array substrate. As shown in FIG. 1, the second data lines 14 extend only in the second display region 12. In other embodiments, the second display region 12 surrounds the first display region 11, the first data lines 13 extend only in the first display region 11, the first data lines 13 do not extend in the second display region 12 and do not provide the data voltage for the second pixel units 121 in the second display region 12, and the second data lines 14 extend only in the second display region 12.

Figure 3:
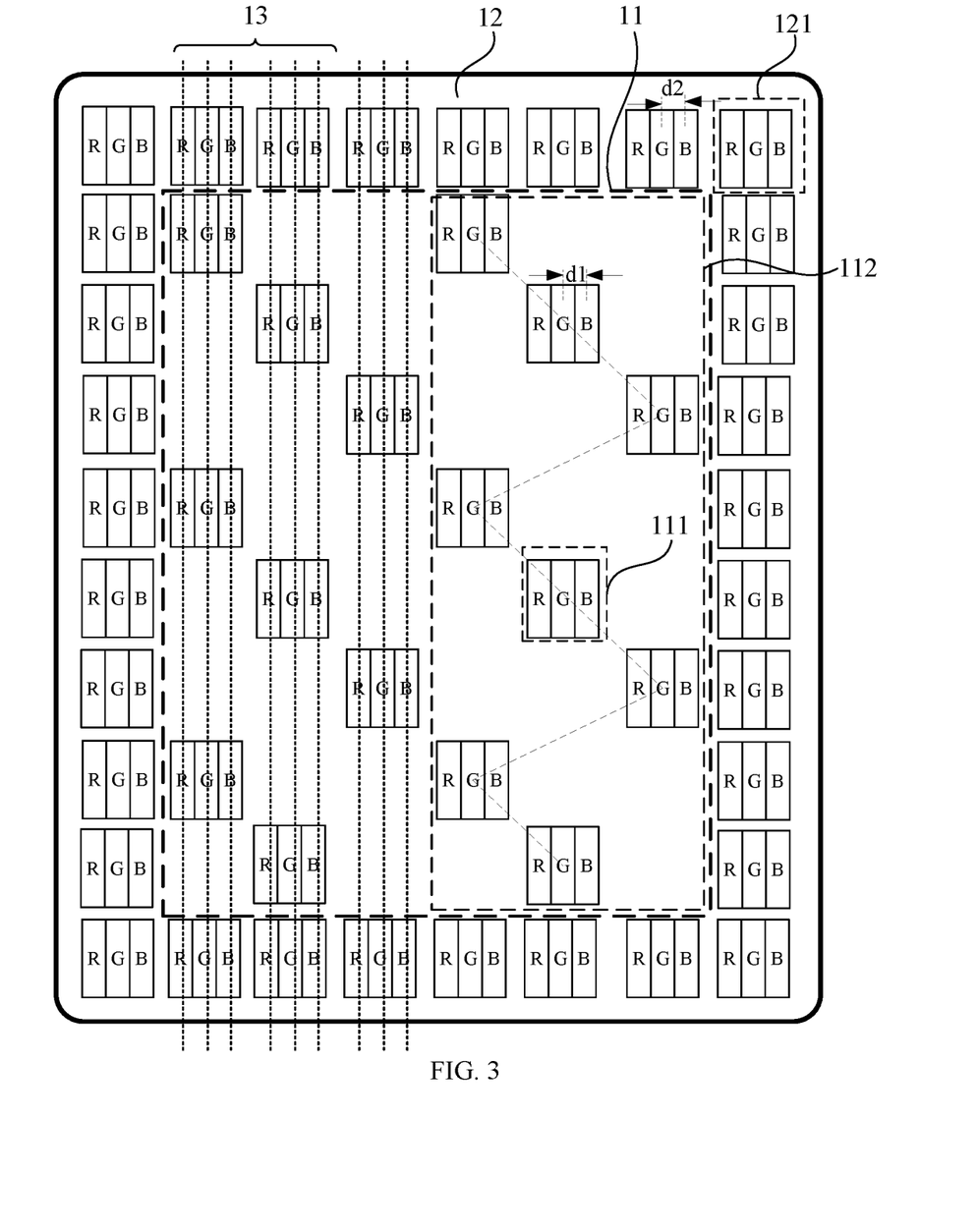
FIG. 3 is a schematic view of another display panel according to an embodiment of the present disclosure.

FIG. 3 is a schematic view of another display panel according to an embodiment of the present disclosure. As shown in FIG. 3, each first pixel unit 111 may include: a first color sub-pixel configured to emit light of a first color, a second color sub-pixel configured to emit light of a second color, and a third color sub-pixel configured to emit light of a third color, and the first color sub-pixel, the second color sub-pixel and the third color sub-pixel are disposed sequentially along the row direction. In the first pixel unit 111, a distance d1 between center positions of adjacent sub-pixels is the width of one sub-pixel in the row direction. Each second pixel unit 121 includes: a first color sub-pixel configured to emit light of a first color, a second color sub-pixel configured to emit light of a second color, and a third color sub-pixel configured to emit light of a third color, and the first color sub-pixel, the second color sub-pixel and the third color sub-pixel are disposed sequentially along the row direction. In the second pixel unit 121, a distance d2 between center positions of adjacent sub-pixels is the width of one sub-pixel in the row direction, and the row direction and the column direction are perpendicular to each other.

FIG. 3 shows an embodiment in which the ratio of the density of the first pixel unit 111 to the density of the second pixel unit 121 is 1:3. The pixel units may be arranged in the row direction and the column direction, and the first data lines 13 and the second data lines 14 extend in the column direction. The array substrate may further include scanning lines, and the scanning lines extend in the row direction. Each of the first pixel units 111 and the second pixel units 121 includes the first color sub-pixel, the second color sub-pixel and the third color sub-pixel disposed sequentially along the row direction. The distance d1 between center positions of adjacent two sub-pixels in the first pixel unit 111 is the row-direction width of sub-pixel the first pixel unit 111, that is, three sub-pixels in the first pixel unit 111 are disposed side by side in the row direction without gap. In the comparison example, the three sub-pixels in the same first pixel unit 111 are separated. Similarly, the distance d2 between center positions of the adjacent sub-pixels in the second pixel unit 121 is the row-direction width of one sub-pixel of the second pixel unit 121, that is, the three sub-pixels in the second pixel unit 121 are disposed side by side in the row direction without gap, as shown in FIG. 3. The sub-pixel in the first pixel unit 111 and the sub-pixel in the corresponding second pixel unit 121 may be disposed in the same column, and lights emitted by these sub-pixels emit are of the same color. For example, the first color sub-pixel in the first pixel unit 111 may be disposed in the same column as the first color sub-pixel in the corresponding second pixel unit 121, the second color sub-pixel in the first pixel unit 111 may be disposed in the same column as the second color sub-pixel in the corresponding second pixel unit 121, and the third color sub-pixel in the first pixel unit 111 may be disposed in the same column as the third color sub-pixel in the corresponding second pixel unit 121. In one or more embodiments, the first color sub-pixel is configured to emit red light, the second color sub-pixel is configured to emit blue light, and the third color sub-pixel is configured to emit green light. In other embodiments, the first color sub-pixel, the second color sub-pixel and the third color sub-pixel further may be configured to emit lights of other colors suitable for display, which is not limited in this embodiment.

In one or more embodiments, as shown in FIG. 3, a ratio of the density of the first pixel units 111 in the first display region 11 to the density of the second pixel units 121 in the second display region 12 is 1:T, where T is an integer greater than or equal to 2. The first display region 11 includes at least one first pixel unit sequence 112 extending in the column direction, and the first pixel unit sequence 112 includes multiple first pixel units 111 whose centers are arranged in a zigzag line. The first pixel units 111 in adjacent two rows are spaced apart from each other in the column direction and the row direction, and the width of the first pixel unit sequence 112 is the total width of T first pixel units 111 in the row direction. As shown in FIG. 3, in the first display region 11, two adjacent first pixel units 111 in the same row are spaced apart by a gap greater than or equal to twice the row-direction width of the first pixel unit 111, and two adjacent first pixel units 111 in the same column are spaced apart by a gap greater than or equal to twice the column-direction length of the first pixel unit 111. FIG. 3 shows an illustrative example in which the first display region 11 includes two pixel unit sequences 112. In other embodiments, the first display region 11 may include three or more pixel unit sequences 112, two adjacent first pixel units 111 in the same row are spaced apart by a gap greater than or equal to twice the row-direction width of the first pixel unit 111, and two adjacent first pixel units 111 in the same column are spaced apart by a gap greater than or equal to twice the column-direction length of the first pixel unit 111.

In the embodiment, one first pixel unit 111 does not correspond to the second pixel units 121 in different columns, and the first pixel units 111 in the first display region 11 are separated from each other. In this way, each first data line 13 can be connected to one or more sub-pixels in the first display region 11.

As shown in FIG. 1 and FIG. 3, the sub-pixels of the first pixel units 111 in the first display region 11 and the sub-pixels of the second pixel units 121 in the second display region 12 are arranged in rows and columns. Each column of sub-pixels is connected to a corresponding data line. Each column in the first display region 11 includes two or more sub-pixels. Two adjacent sub-pixels in the same column in the first display region 11 are separated by a first gap. Two adjacent sub-pixels in the same column in the second display region 12 are separated by a second gap, which is smaller than the first gap. In an exemplary embodiment, the first gap is greater than twice the column-direction length of one sub-pixel. The distance between the center positions of two adjacent sub-pixels in the same column in the second display region 12 is equal to the second gap plus the column-direction length of one sub-pixel.

Figure 4:
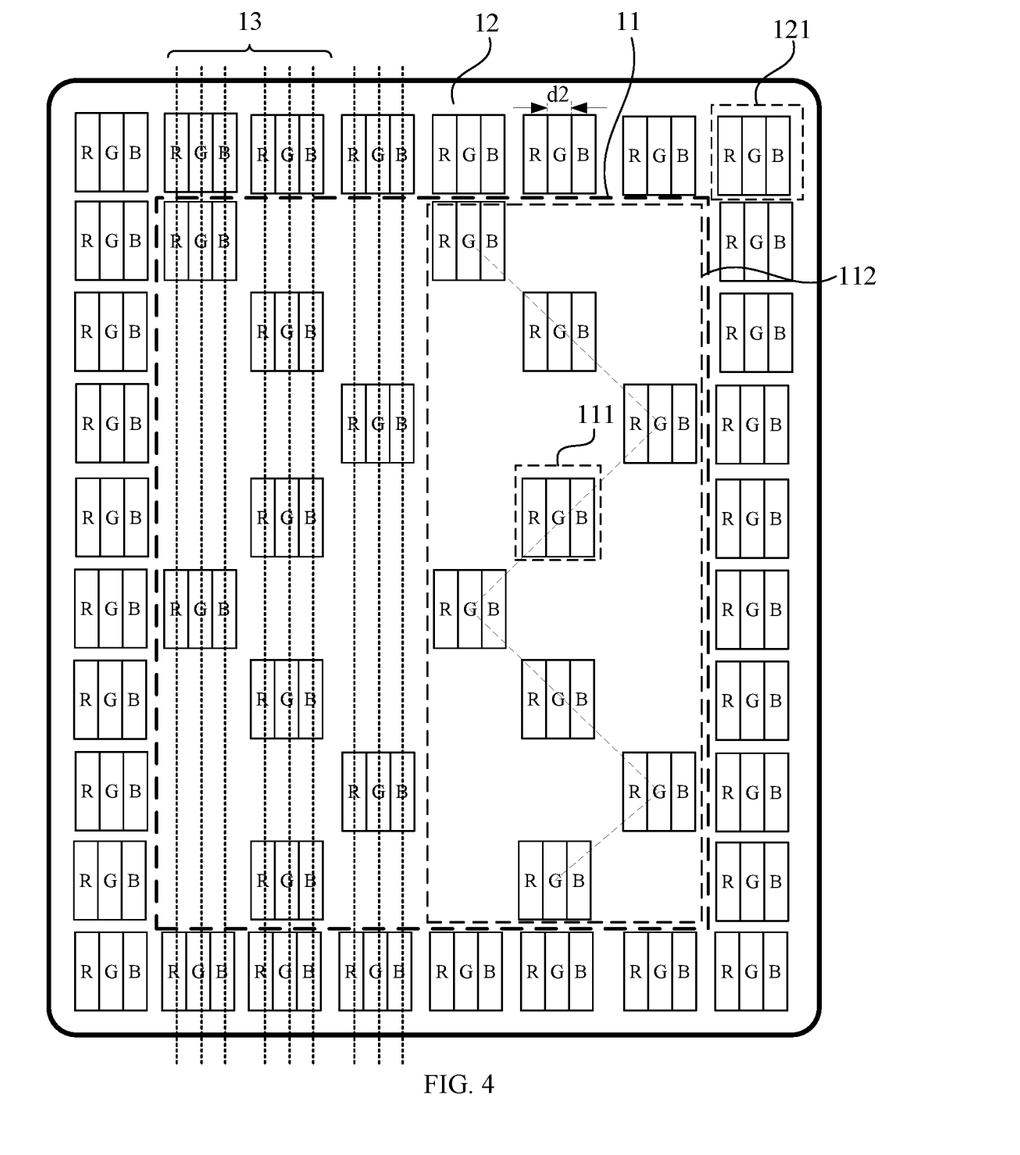
FIG. 4 is a schematic view of another display panel according to an embodiment of the present disclosure.
Figure 5:
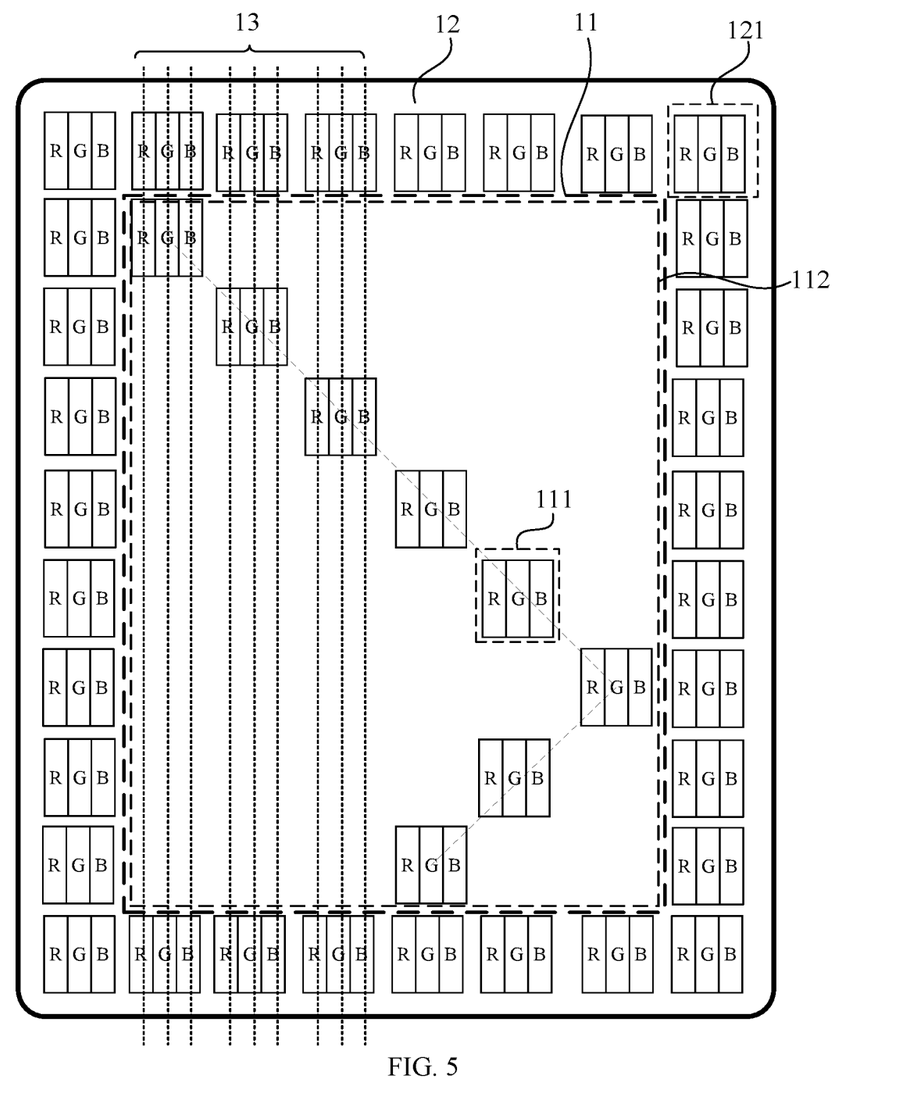
FIG. 5 is a schematic view of another display panel according to an embodiment of the present disclosure.

As shown in FIG. 3, the ratio of the density of the first pixel units 111 to the density of the second pixel units 121 is 1:T, and the first display region 11 includes at least one first pixel unit sequence 112 extending in the column direction. The first pixel unit sequence 112 includes multiple first pixel units 111 arranged in the zigzag line, and the first pixel units 111 in two adjacent rows are spaced apart from each other in the column direction and the row direction. The row-direction width of the first pixel unit sequence 112 is equal to the total width of T first pixel units 111 in the row direction, so that each first data line 13 is connected to the sub-pixel of the first pixel unit 111. FIG. 3 shows an exemplary arrangement of the first pixel unit sequence 112 in which T=3, and T first pixel units 111 may form a minimum repeating unit in the column direction. FIG. 4 is a schematic view of another display panel according to an embodiment of the present disclosure. FIG. 4 shows another arrangement of the first pixel unit sequence 112, in which T=3. The minimum repeating unit in the column direction includes (2T−2) first pixel units 111. In the present disclosure, T may be a positive integer greater than or equal to 1. FIG. 5 is a schematic view of another display panel according to an embodiment of the present disclosure. In the embodiment shown in FIG. 5, T is equal to 6, the row-direction width of the first pixel sequence 112 is equal to the width of 6 first pixel units 111 in the row direction, and the first pixel units 111 in two adjacent rows are spaced apart from each other in the column direction and the row direction.

As shown in FIG. 3 and FIG. 4, the first pixel unit sequences 112 are arranged in an array, and the first pixel units 111 and the second pixel units 121 are arranged in columns. Each first pixel unit 111 includes one first color sub-pixel, one second color sub-pixel, and one third color sub-pixel. Each second pixel unit 121 also includes one first color sub-pixel, one second color sub-pixel, and one third color sub-pixel. The sub-pixels of the first pixel units 111 and the second pixel units 121 are also arranged in sub-pixel columns. One pixel column corresponds to three sub-pixel columns. For the first pixel units 111 and the second pixel units 121 which are arranged in the same column, their first color sub-pixels are in the same sub-pixel column and connected to the same data line, their second color sub-pixels are in the same sub-pixel column and connected to the same data line, and their third color sub-pixels are in the same sub-pixel column and connected to the same data line. In the present embodiment, the second display region 12 surrounds the first display region 11, the first pixel unit 111 and the corresponding second pixel units 121 are arranged in the same column, and each sub-pixel in the first pixel unit 111 is disposed in the same sub-pixel column as the same color sub-pixels in the corresponding second pixel units 121. Each sub-pixel in the first pixel unit 111 and the sub-pixels in the corresponding second pixel units 121 of the same light emission type are electrically connected to the same first data line 13, so that the data line arrangement of the first display region 11 and the second display region 12 is facilitated, and the data line arrangement of the present embodiment is same as the common data line arrangement, and the pixel arrangement mode of the present embodiment can be applied to various display panels.

In one or more embodiments, an area of the sub-pixel of the first pixel unit 111 is smaller than an area of the sub-pixel of the second pixel unit 121. In order to further increase the light transmittance of the first display region, the area of the sub-pixel of the first pixel unit 111 is smaller than the area of the sub-pixel of the second pixel unit 121, so that the sensor in the reserved region has better operating performance.

In one or more embodiments, the sub-pixel of the first pixel unit 111 and the sub-pixel of the second pixel unit 121 are identical in sizes. In the fabrication of the display panel in the embodiments shown in FIG. 3 and FIG. 4, the first pixel units 111 and the second pixel units 121 may be simultaneously formed by adopting the same process, and the universality of the pixel unit formation process in the present embodiment is enhanced.

As shown in FIG. 1, the first pixel unit 111 may include the first color sub-pixel, the second color sub-pixel and the third color sub-pixel sequentially arranged in the row direction. In the first pixel unit 111, the distance d1 between center positions of the adjacent sub-pixels is greater than the row-direction width of one sub-pixel of the first pixel unit 111. The second pixel unit 121 also includes the first color sub-pixel, the second color sub-pixel and the third color sub-pixel sequentially arranged in the row direction. In the second pixel unit 121, the distance d2 between the center positions of the adjacent sub-pixels is equal to the row-direction width of one sub-pixel of the second pixel unit 121. The row direction and the column direction are perpendicular to each other.

As shown in FIG. 1, the first pixel unit 111 includes the first color sub-pixel, the second color sub-pixel and the third color sub-pixel arranged side by side in the row direction. It is to be noted that the arrangement of the first color sub-pixel, the second color sub-pixel and the third color sub-pixel is not limited to the above manner. For example, the arrangement sequence of the first color sub-pixel, the second color sub-pixel and the third color sub-pixel is the second color sub-pixel, the third color sub-pixel, and the first color sub-pixel.

In the first pixel unit 111, the distance d1 between the center positions of adjacent sub-pixels is greater than the row-direction width of the sub-pixel of the first pixel unit 111, that is, the adjacent sub-pixels in the first pixel unit 111 are not directly next to each other, but are spaced apart by a gap. As shown in FIG. 1, the adjacent sub-pixels in the first pixel unit 111 respectively correspond to the second pixel units 121 in different columns. The second pixel unit 121 includes the first color sub-pixel, the second color sub-pixel and the third color sub-pixel arranged sequentially in the row direction, and the adjacent sub-pixels are directly next to each other.

In one or more embodiments, as shown in FIG. 1, the ratio of the density of the first pixel units 111 in the first display region 11 to the density of the second pixel units 121 in the second display region 12 is 1:N, where N is an integer greater than or equal to 2. Each first pixel unit 111 corresponds to adjacent N columns of second pixel units. The first display region 11 includes a plurality of sub-pixel sequences extending in the column direction, and each sub-pixel sequence includes a first color sub-pixel sequence, a second color sub-pixel sequence and a third color sub-pixel sequence. Each sub-pixel sequence includes multiple sub-pixels of the same color arranged in a zigzag manner. The sub-pixels in two adjacent rows are spaced apart in the column direction and the row direction. The width of the sub-pixel sequence is equal to the width of (3N−2) sub-pixels of the first pixel units in the row direction.

When adjacent sub-pixels in the first pixel unit 111 are separated by a certain distance, each first pixel unit 111 corresponds to adjacent N columns of second pixel units. Exemplarily, as shown in FIG. 1, each first pixel unit 111 corresponds to adjacent 3 columns of second pixel units, and the zigzag-shaped first color sub-pixel sequence, the zigzag-shaped second color sub-pixel sequence and the zigzag-shaped third color sub-pixel sequence extend in the column direction of the three columns of second pixel units corresponding to the first pixel unit 111. As shown in FIG. 1, the first color sub-pixel is a red sub-pixel, the second color sub-pixel is a blue sub-pixel, and the third color sub-pixel is a green sub-pixel, and the first display region includes: a red sub-pixel column, a blue sub-pixel column, and a green sub-pixel column. In FIG. 1, the red sub-pixel column is represented by the dotted zigzag line and the green sub-pixel column is represented by the solid zigzag line. In one sub-pixel sequence, the sub-pixels in adjacent two rows are spaced apart in the column direction and the row direction, so that the first data lines 13 which are respectively connected to 3 columns of second pixel units corresponding to the first pixel unit 111 each can be connected to the sub-pixel in the first display region 11. The width of the sub-pixel sequence is equal to the total width of (3N−2) sub-pixels of the first pixel units 111 in the row direction. For example, if N is 3, the width of the sub-pixel sequence is the width of 7 sub-pixels in the row direction.

Optionally, as shown in FIG. 1, the sub-pixels of the sub-pixels first pixel units 111 are arranged in an array, and each sub-pixel and a same color sub-pixel in the second pixel unit 121 in the corresponding column correspond to each other in a column-direction position and are electrically connected to the same data line. In the embodiment, the second display region 12 surrounds the first display region 11, the sub-pixel of the first pixel unit 111 is disposed in the same column as the same color sub-pixel of the second pixel unit 121 in the corresponding column, and the sub-pixel of the first pixel unit 111 and the same color sub-pixel of in the corresponding second pixel unit 121 are electrically connected to the same first data line 13, so that the data line arrangement in the first display region 11 and the second display region 12 is facilitated. The data line arrangement in the present embodiment is the same as the common data line arrangement, and the universality of the pixel arrangement mode of the embodiment is enhanced.

Optionally, as shown in FIG. 1, N=3. The first color sub-pixel, the second color sub-pixel and the third color sub-pixel of the first pixel unit 111 in the i-th row are successively arranged in the row direction. The second color sub-pixel, the third color sub-pixel and the first color sub-pixel of the first pixel unit 111 in the (i+1)-th row are successively arranged in the row direction. The third color sub-pixel, the first color sub-pixel and the second color sub-pixel of the first pixel unit 111 in the (i+2)-th row are successively arranged in the row direction. The first color sub-pixel, the second color sub-pixel and the third color sub-pixel of the first pixel unit 111 in the (i+3)-th row are successively arranged in the row direction. i is an integer greater than or equal to 1, and less than or equal to (M−2); and M is a total number of rows of first pixel units.

In the embodiment shown in FIG. 1, the first color sub-pixel is the red sub-pixel, the second color sub-pixel is the green sub-pixel, and the third color sub-pixel is the blue sub-pixel, and N=3. The first pixel unit 111 in the first row includes the red sub-pixel, the green sub-pixel and the blue sub-pixel successively arranged in the row direction. The first pixel unit 111 in the second row includes the green sub-pixel, the blue sub-pixel and the red sub-pixel successively arranged in the row direction. The first pixel unit 111 in the third row includes the blue sub-pixel, the red sub-pixel and the green sub-pixel successively arranged in the row direction. The arrangement order of the sub-pixels of the first pixel unit 111 in the fourth row is the same order as that in the first pixel unit 111 in the first row, that is, the first pixel unit 111 in the fourth row includes the red sub-pixel, the green sub-pixel and the blue sub-pixel successively arranged in the row direction. With the above configuration, the sub-pixels of various colors are disposed in a staggered mode, so that the first data lines 13 which are connected to the sub-pixel columns of the second pixel units 121 corresponding to the sub-pixel of the first pixel unit 111 are each connected to the corresponding color sub-pixel in the first display region 11.

Figure 6:
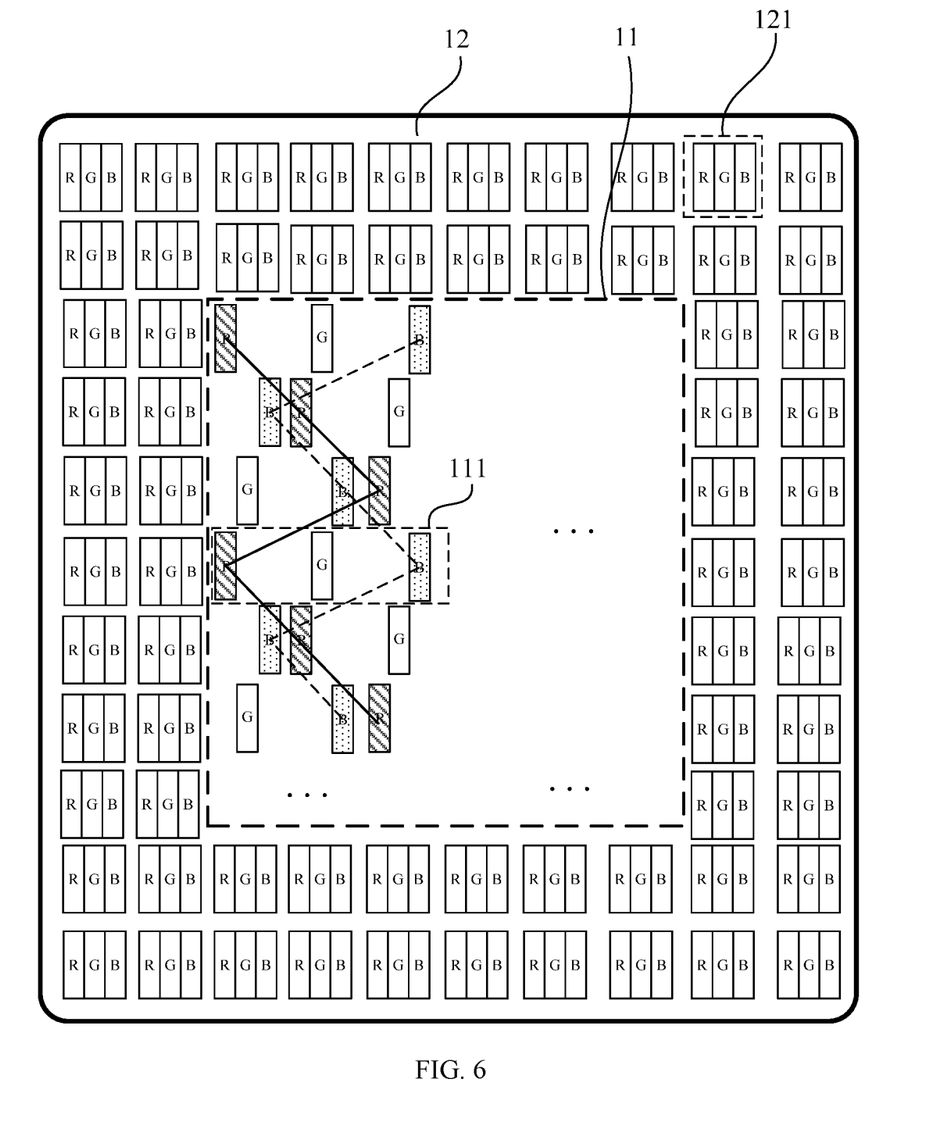
FIG. 6 is a schematic view of another display panel according to an embodiment of the present disclosure.

FIG. 6 is a schematic view of another display panel according to an embodiment of the present disclosure. In the embodiment shown in FIG. 6, N=3. The first pixel unit 111 in the i-th row includes the first color sub-pixel, the second color sub-pixel and the third color sub-pixel successively arranged in the row direction. The first pixel unit 111 in the (i+1)-th row includes the third color sub-pixel, the first color sub-pixel and the second color sub-pixel successively arranged in the row direction. The first pixel unit 111 in the (i+2)-th row includes the second color sub-pixel, the third color sub-pixel and the first color sub-pixel successively arranged in the row direction. The first pixel unit 111 in the (i+3)-th row includes the first color sub-pixel, the second color sub-pixel and the third color sub-pixel successively arranged in the row direction, where i is an integer greater than or equal to 1, and less than or equal to (M−2); and M is a total number of rows of first pixel units.

Similarly, if the first color sub-pixel is the red sub-pixel, the second color sub-pixel is the green sub-pixel, and the third color sub-pixel is the blue sub-pixel, as shown in FIG. 1, when N=3, the first pixel unit 111 in the first row includes the red sub-pixel, the green sub-pixel and the blue sub-pixel successively arranged in the row direction; the first pixel unit 111 in the second row includes the blue sub-pixel, the red sub-pixel and the green sub-pixel successively arranged in the row direction; the first pixel unit 111 in the third row includes the green sub-pixel, the blue sub-pixel and the red sub-pixel successively arranged in the row direction; and the arrangement order of the sub-pixels of the first pixel unit 111 in the fourth row is the same as that in the first pixel unit in the first row, that is, the first pixel unit 111 in the fourth row includes the red sub-pixel, the green sub-pixel and the blue sub-pixel successively arranged in the row direction. FIG. 6 and FIG. 1 show two different sub-pixel arrangements in the first display region 11 when N=3. In either of the two different sub-pixel arrangements, the sub-pixel sequences of different colors are disposed in a staggered mode, and the first data lines 13 which are connected to the sub-pixel columns of the second pixel unit 121 in a column corresponding to the sub-pixel of the first pixel unit 111 are each connected to the corresponding color sub-pixel in the first display region 11, so that the connected sub-pixel numbers of the first data lines 13 in the first display region 11 are similar, the loads of the first data lines 13 are similar, and the display uniformity of the display panel is enhanced.

Figure 7:
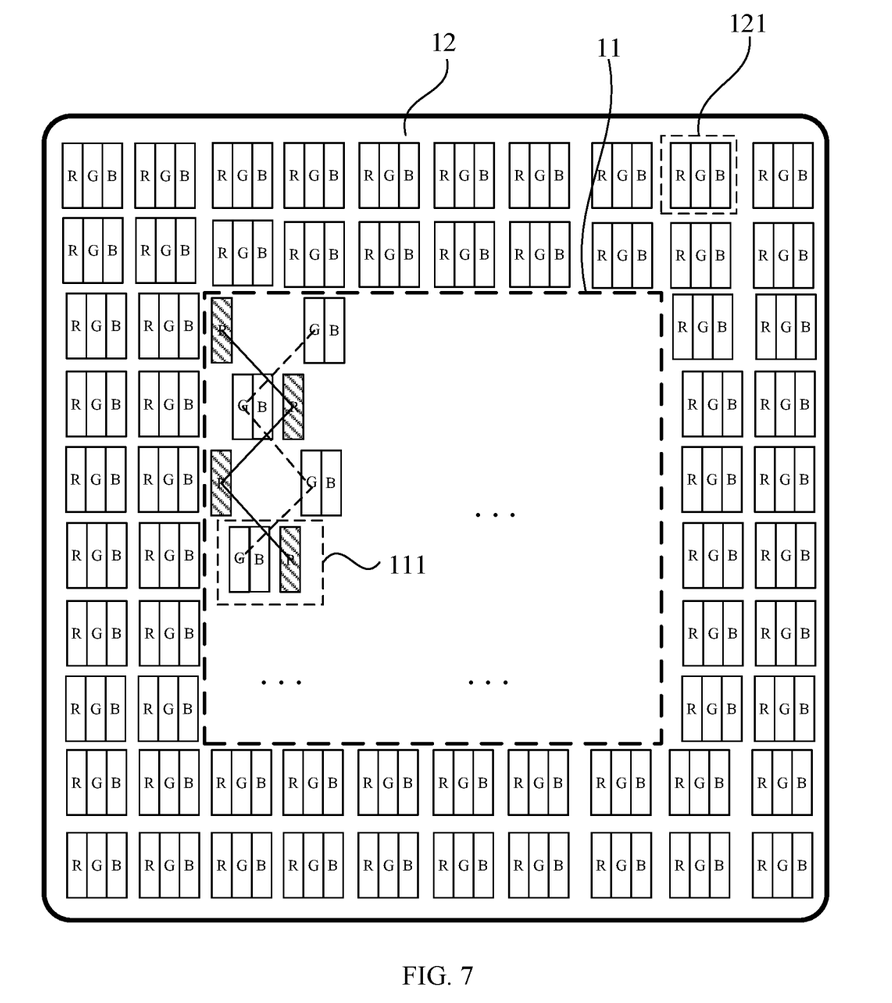
FIG. 7 is a schematic view of another display panel according to an embodiment of the present disclosure.
Figure 8:
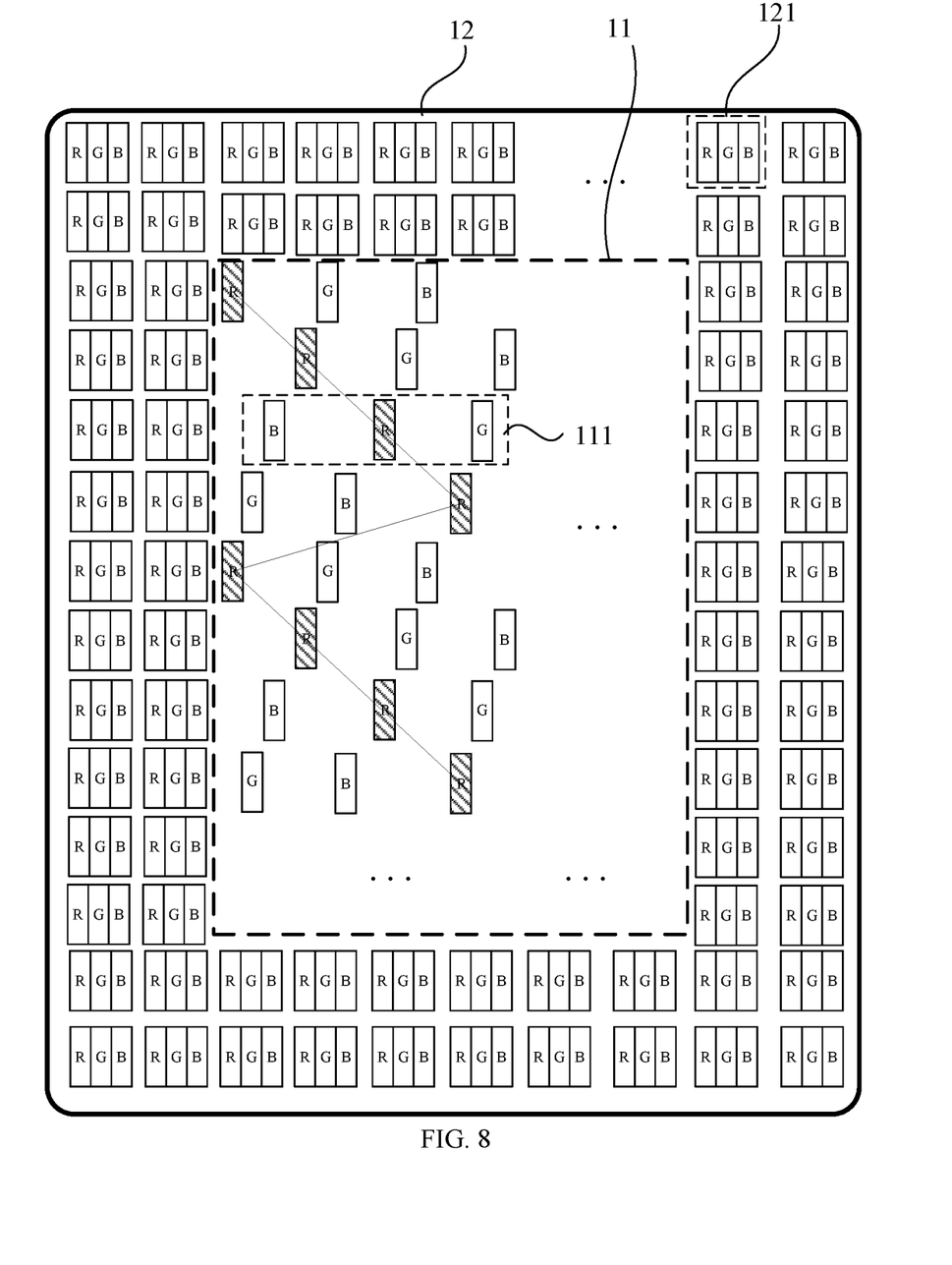
FIG. 8 is a schematic view of another display panel according to an embodiment of the present disclosure.

Furthermore, when the sub-pixels of the first pixel unit 111 are dispersedly disposed (that is, spaced apart), the value of N may be an integer greater than or equal to 2. FIG. 7 is a schematic view of another display panel according to an embodiment of the present disclosure and FIG. 8 is a schematic view of yet another display panel according to an embodiment of the present disclosure. In FIG. 7, the value of N is 2, and each first pixel unit 111 corresponds to two columns of second pixel unit columns. The first pixel unit 111 in the p-th row includes the first color sub-pixel, the second color sub-pixel and the third color sub-pixel successively arranged in the row direction; the first pixel unit 111 in the (p+1)-th row includes the second color sub-pixel, the third color sub-pixel and the first color sub-pixel successively arranged in the row direction; the first pixel unit 111 in the (p+2)-th row includes the first color sub-pixel, the second color sub-pixel and the third color sub-pixel successively arranged in the row direction; p is an integer greater than or equal to 1, and less than or equal to (M−2); and M is a total number of rows of first pixel units. In this way, each two rows of first pixel units 111 enable each first data line 13 to be connected to the sub-pixel in the first display region 11.

In the embodiment shown in FIG. 8, the value of N is 4, each first pixel unit 111 corresponds to four columns of second pixel unit columns. The first pixel unit 111 in the p-th row includes the first color sub-pixel, the second color sub-pixel and the third color sub-pixel successively arranged in the row direction; the first pixel unit 111 in the (p+1)-th row includes the first color sub-pixel, the second color sub-pixel and the third color sub-pixel successively arranged in the row direction; the first pixel unit 111 in the (p+2)-th row includes the third color sub-pixel, the first color sub-pixel and the second color sub-pixel successively arranged in the row direction; the first pixel unit 111 in the (p+3)-th row includes the second color sub-pixel, the third color sub-pixel and the first color sub-pixel successively arranged in the row direction; and the first pixel unit 111 in the (p+4)-th row includes the first color sub-pixel, the second color sub-pixel and the third color sub-pixel successively arranged in the row direction, p is an integer greater than or equal to 1, and less than or equal to (M−3); and M is a total number of rows of first pixel units. The four rows of first pixel units 111 enable each first data line 13 to be connected to the sub-pixel in the first display region 11, so that the display uniformity of the display panel is achieved.

Optionally, each first data line 13 may be connected to the same number of sub-pixels of the first pixel unit 111, thereby enhancing the load uniformity of the first data lines 13, and further increasing the display uniformity of the first display region 11.

Figure 9:
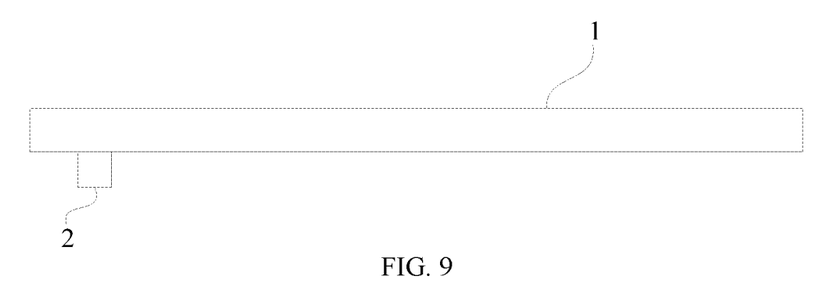
FIG. 9 is a schematic view of a display apparatus according to an embodiment of the present disclosure.

An embodiment of the present disclosure further provides a display apparatus. FIG. 9 is a schematic view of the display apparatus according to the embodiment of the present disclosure. The display apparatus includes: a display panel 1 provided in any embodiment of the present disclosure, and a sensor 2 disposed on a non-display side of the reserved region of the display panel 1. The display apparatus provided in the embodiment of the present disclosure may be a mobile phone, or may also be a computer, a television, a smart wearable display device, or the like, which is not specifically limited in the embodiment of the present disclosure.

In one or more embodiments, the sensor 2 may include one or more of a camera module, a photosensitive sensor and an ultrasonic distance sensor, which is not specifically limited in the embodiment of the present disclosure.

It is to be noted that the above are merely exemplary embodiments of the present disclosure and the technical principles used therein. It will be understood by those skilled in the art that the present disclosure is not limited to the specific embodiments described herein. Those skilled in the art can make various apparent modifications, adaptations and substitutions without departing from the scope of the present disclosure. Therefore, while the present disclosure has been described in detail through the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. A display panel having display regions, comprising:
a first display region, wherein the first display region is used for disposing a sensor;
a second display region surrounding the first display region;
first pixel units in the first display region;
second pixel units in the second display region; and
an array substrate, wherein the array substrate comprises a plurality of first data lines and a plurality of second data lines, and the plurality of first data lines pass through the first display region,
wherein in the first display region, each of the plurality of first data lines is electrically connected to a sub-pixel of the first pixel units,
wherein each of the first pixel units comprises a first color sub-pixel, a second color sub-pixel and a third color sub-pixel disposed sequentially along a row direction,
wherein in each of the first pixel units, a distance between center positions of adjacent sub-pixels is equal to a row-direction width of one sub-pixel of the first pixel unit,
wherein each of the second pixel units comprises a first color sub-pixel, a second color sub-pixel and a third color sub-pixel disposed sequentially along the row direction,
wherein in each of the second pixel units, a distance between center positions of adjacent sub-pixels is equal to a row-direction width of one sub-pixel of the second pixel unit,
wherein a ratio of the density of the first pixel units in the first display region to the density of the second pixel units in the second display region is 1: T, where T is an integer greater than or equal to 2, and
wherein: the first display region comprises at least one first pixel unit sequence extending in the column direction; each of the at least one first pixel unit sequence comprises a plurality of first pixel units, and center positions of the plurality of first pixel units form a zigzag line; the first pixel units in two adjacent rows are spaced apart in the column direction and the row direction; and a width of each of the at least one first pixel unit sequence is equal to a total width of T first pixel units in the row direction.

2. The display panel of claim 1, wherein the plurality of first data lines pass through the first display region and extend in the second display region.

3. The display panel of claim 1, wherein the first display region comprises a plurality of first pixel unit sequences arranged in an array,
wherein the sub-pixels of the first pixel units and the sub-pixels of the second pixel units are also arranged in an array, and the sub-pixels in a same sub-pixel column of the sub-pixel array are connected to a same data line, and
wherein for the first pixel units and the second pixel units which are arranged in the same pixel unit column, first color sub-pixels are arranged in a same sub-pixel column, second color sub-pixels are arranged in a same sub-pixel column, and third color sub-pixels are arranged in a same sub-pixel column.

4. The display panel of claim 1, wherein each of the plurality of first data lines is connected to a same number of sub-pixels of the first pixel units.

5. The display panel of claim 1, wherein an area of the sub-pixel of the first pixel unit is smaller than an area of the sub-pixel of the second pixel unit.

6. The display panel of claim 1, wherein an area of the sub-pixel of the first pixel unit is equal to an area of the sub-pixel of the second pixel unit.

7. A display panel having display regions, comprising:
a first display region, wherein the first display region is used for disposing a sensor;
a second display region surrounding the first display region;
first pixel units in the first display region;
second pixel units in the second display region; and
an array substrate, wherein the array substrate comprises a plurality of first data lines and a plurality of second data lines, and the plurality of first data lines pass through the first display region,
wherein each of the first pixel units comprises a first color sub-pixel, a second color sub-pixel and a third color sub-pixel disposed in a row direction,
wherein in each of the first pixel units, a distance between center positions of adjacent sub-pixels is greater than a row-direction width of one sub-pixel of the first pixel unit, wherein each of the second pixel units comprises a first color sub-pixel, a second color sub-pixel and a third color sub-pixel disposed sequentially along the row direction, wherein in each of the second pixel units, a distance between center positions of adjacent sub-pixels is equal to a row-direction width of one sub-pixel of the second pixel unit, wherein a ratio of the density of the first pixel units in the first display region to the density of the second pixel units in the second display region is 1: N, where N is an integer greater than or equal to 2, wherein each of the first pixel units corresponds to N adjacent columns of second pixel units, and wherein: the first display region comprises a plurality of sub-pixel sequences extending in the column direction; the plurality of sub-pixel sequences comprise a first color sub-pixel sequence, a second color sub-pixel sequence and a third color sub-pixel sequence; the first color sub-pixel sequence comprises a plurality of first color sub-pixels, and center positions of which form a zigzag line; the second color sub-pixel sequence comprises a plurality of second color sub-pixels, and center positions of which form a zigzag line; the third color sub-pixel sequence comprises a plurality of third color sub-pixels, and center positions of which form a zigzag line; the sub-pixels in two adjacent rows are spaced apart in the column direction and the row direction; and a width of each of the sub-pixel sequences is equal to a width of (3N−2) sub-pixels of the first pixel units in the row direction.

8. The display panel of claim 7, wherein: the sub-pixels of the first pixel units and the sub-pixels of the second pixel units are arranged in an array; and the sub-pixels in a same sub-pixel column of the sub-pixel array are connected to a same data line, and wherein for the first pixel units and the second pixel units which are arranged in the same pixel unit column, first color sub-pixels are arranged in a same sub-pixel column, second color sub-pixels are arranged in a same sub-pixel column, and third color sub-pixels are arranged in a same sub-pixel column.

9. The display panel of claim 8, wherein: N=3;

each first pixel unit in an i-th row comprises the first color sub-pixel, the second color sub-pixel and the third color sub-pixel successively arranged along the row direction;

each first pixel unit in an (i+1)-th row comprises the third color sub-pixel, the first color sub-pixel and the second color sub-pixel successively arranged along the row direction;

each first pixel unit in an (i+2)-th row comprises the second color sub-pixel, the third color sub-pixel and the first color sub-pixel successively arranged along the row direction; and each first pixel unit in an (i+3)-th row comprises the first color sub-pixel, the second color sub-pixel and the third color sub-pixel successively arranged along the row direction, and wherein: i is an integer greater than or equal to 1, and less than or equal to (M−2); and M is a total number of rows of the first pixel units in the first display region.

10. The display panel of claim 8, wherein: N=3;

each first pixel unit in an i-th row comprises the first color sub-pixel, the second color sub-pixel and the third color sub-pixel successively arranged along the row direction;

each first pixel unit in an (i+1)-th row comprises the second color sub-pixel, the third color sub-pixel and the first color sub-pixel successively arranged along the row direction;

each first pixel unit in an (i+2)-th row comprises the third color sub-pixel, the first color sub-pixel and the second color sub-pixel successively arranged along the row direction; and each first pixel unit in an (i+3)-th row comprises the first color sub-pixel, the second color sub-pixel and the third color sub-pixel successively arranged along the row direction, and wherein: i is an integer greater than or equal to 1, and less than or equal to (M−2); and M is a total number of rows of the first pixel units in the first display region.

11. A display apparatus, comprising: a display panel and a sensor, wherein the display panel comprises:

a first display region, wherein the first display region is used for disposing the sensor;

a second display region surrounding the first display region;

first pixel units in the first display region;

second pixel units in the second display region; and an array substrate, wherein the array substrate comprises a plurality of first data lines and a plurality of second data lines, and the plurality of first data lines pass through the first display region, wherein in the first display region, each of the plurality of first data lines is electrically connected to a sub-pixel of the first pixel units, wherein the sensor disposed on a non-display side of the first display region of the display panel, wherein each of the first pixel units comprises a first color sub-pixel, a second color sub-pixel and a third color sub-pixel disposed sequentially along a row direction, wherein in each of the first pixel units, a distance between center positions of adjacent sub-pixels is equal to a row-direction width of one sub-pixel of the first pixel unit, wherein each of the second pixel units comprises a first color sub-pixel, a second color sub-pixel and a third color sub-pixel disposed sequentially along the row direction, wherein in each of the second pixel units, a distance between center positions of adjacent sub-pixels is equal to a row-direction width of one sub-pixel of the second pixel unit, wherein a ratio of the density of the first pixel units in the first display region to the density of the second pixel units in the second display region is 1: T, where T is an integer greater than or equal to 2, and wherein: the first display region comprises at least one first pixel unit sequence extending in the column direction; each of the at least one first pixel unit sequence comprises a plurality of first pixel units, and center positions of the plurality of first pixel units form a zigzag line; the first pixel units in two adjacent rows are spaced apart in the column direction and the row direction; and a width of each of the at least one first pixel unit sequence is equal to a total width of T first pixel units in the row direction.

12. The display apparatus of claim 11, wherein the sensor comprises one or more of a camera module, a photosensitive sensor or an ultrasonic distance sensor.

13. The display apparatus of claim 11, wherein the first display region comprises a plurality of first pixel unit sequences arranged in an array,
- wherein the sub-pixels of the first pixel units and the sub-pixels of the second pixel units are also arranged in an array, and the sub-pixels in a same sub-pixel column of the sub-pixel array are connected to a same data line, and
- wherein for the first pixel units and the second pixel units which are arranged in the same pixel unit column, first color sub-pixels are arranged in a same sub-pixel column, second color sub-pixels are arranged in a same sub-pixel column, and third color sub-pixels are arranged in a same sub-pixel column.

14. The display apparatus of claim 11, wherein each of the first pixel units comprises a first color sub-pixel, a second color sub-pixel and a third color sub-pixel disposed in a row direction,
- wherein in each of the first pixel units, a distance between center positions of adjacent sub-pixels is greater than a row-direction width of one sub-pixel of the first pixel unit,
- wherein each of the second pixel units comprises a first color sub-pixel, a second color sub-pixel and a third color sub-pixel disposed sequentially along the row direction, and
- wherein in each of the second pixel units, a distance between center positions of adjacent sub-pixels is equal to a row-direction width of one sub-pixel of the second pixel unit.

\* \* \* \* \*